United States Patent
Le et al.

(10) Patent No.: US 6,208,561 B1
(45) Date of Patent: Mar. 27, 2001

(54) METHOD TO REDUCE CAPACITIVE LOADING IN FLASH MEMORY X-DECODER FOR ACCURATE VOLTAGE CONTROL AT WORDLINES AND SELECT LINES

(75) Inventors: Binh Q. Le, Mountain View; Kazuhiro Kurihara, Sunnyvale; Pau-Ling Chen, Saratoga, all of CA (US)

(73) Assignees: Advanced Micro Devices, Inc., Sunnyvale, CA (US); Fujitsu Ltd. (JP)

( * ) Notice: Subject to any disclaimer, the term of this patent is extended or adjusted under 35 U.S.C. 154(b) by 0 days.

(21) Appl. No.: 09/593,303

(22) Filed: Jun. 13, 2000

(51) Int. Cl.[7] .................................................. G11C 16/06
(52) U.S. Cl. ............................ 365/185.23; 365/230.06
(58) Field of Search .......................... 365/185.23, 230.06, 365/226

(56) References Cited

U.S. PATENT DOCUMENTS 5,787,034 * 7/1998 Omino et al. ................... 365/185.23
5,787,037 * 7/1998 Amanai ............................ 365/185.23
5,841,696 * 11/1998 Chen et al. ....................... 365/185.11
5,917,354 * 6/1999 Nakai et al. ..................... 365/185.23
6,111,809 * 8/2000 Micheloni et al. .............. 365/230.06

* cited by examiner

Primary Examiner—Son T. Dinh
(74) Attorney, Agent, or Firm—Davis Chin

(57) ABSTRACT

An apparatus and a method for reducing capacitive loading in a Flash memory X-decoder so as to accurately control the voltages as selected wordlines and block select lines are provided. A decoding structure separately applies a first boosted voltage to the wordline N-well region and a second boosted voltage to the selected wordline so as to reduce capacitive loading on the selected wordline due to heavy capacitive loading associated with the wordline N-well region. The decoding structure further applies a third boosted voltage to the select gate N-well region and a fourth boosted voltage to the block select line so as to reduce capacitive loading on the block select line due to heavy capacitive loading associated with the select gate N-well region. As a consequence, an accurate voltage can be created quickly at the selected wordline since its capacitive loading path is very small.

24 Claims, 6 Drawing Sheets

Fig. 2a
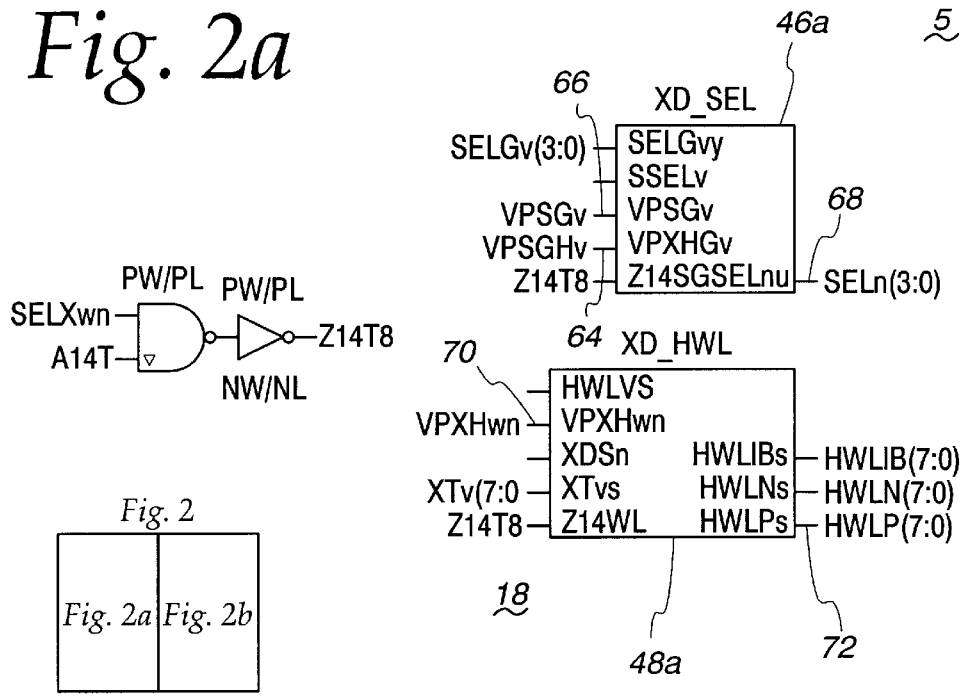
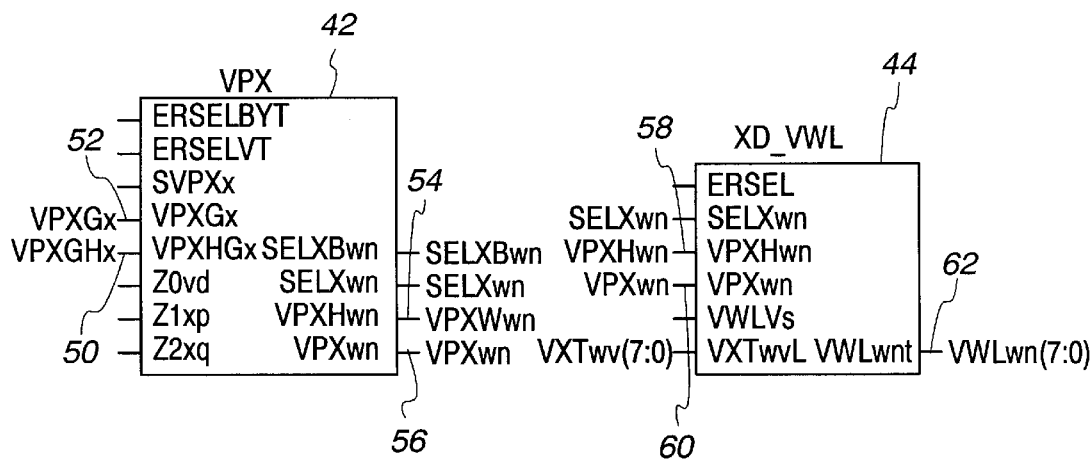
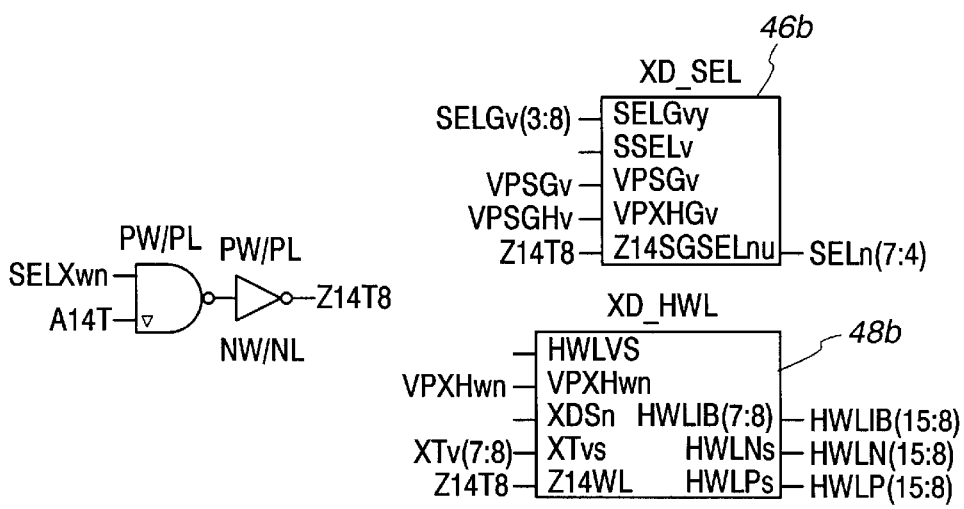

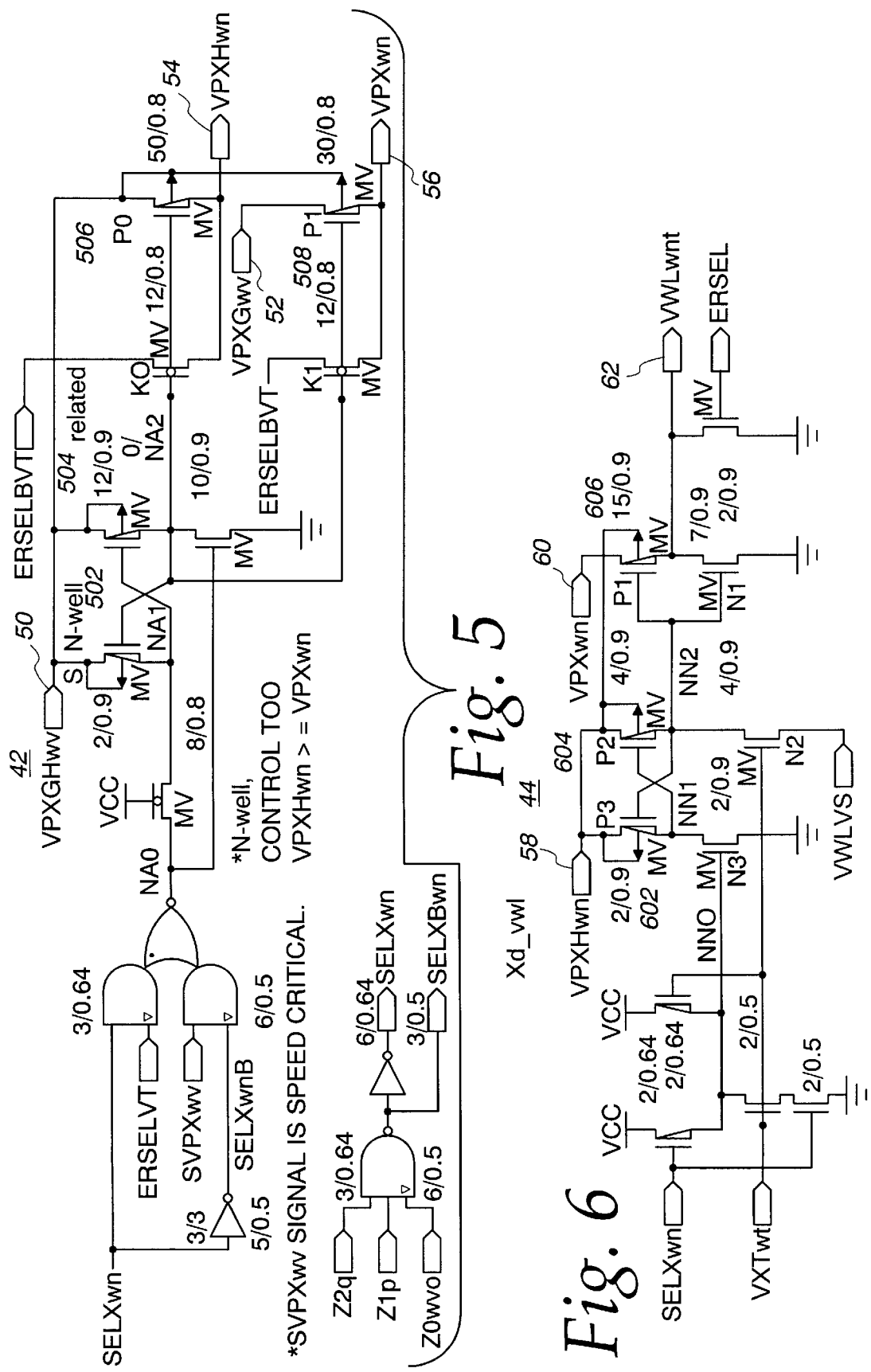

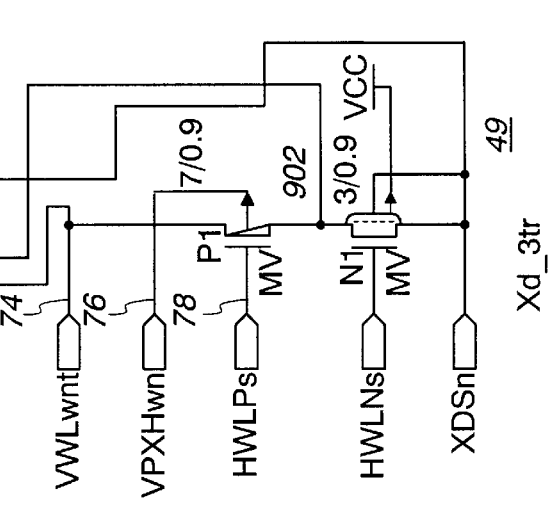
Fig. 9
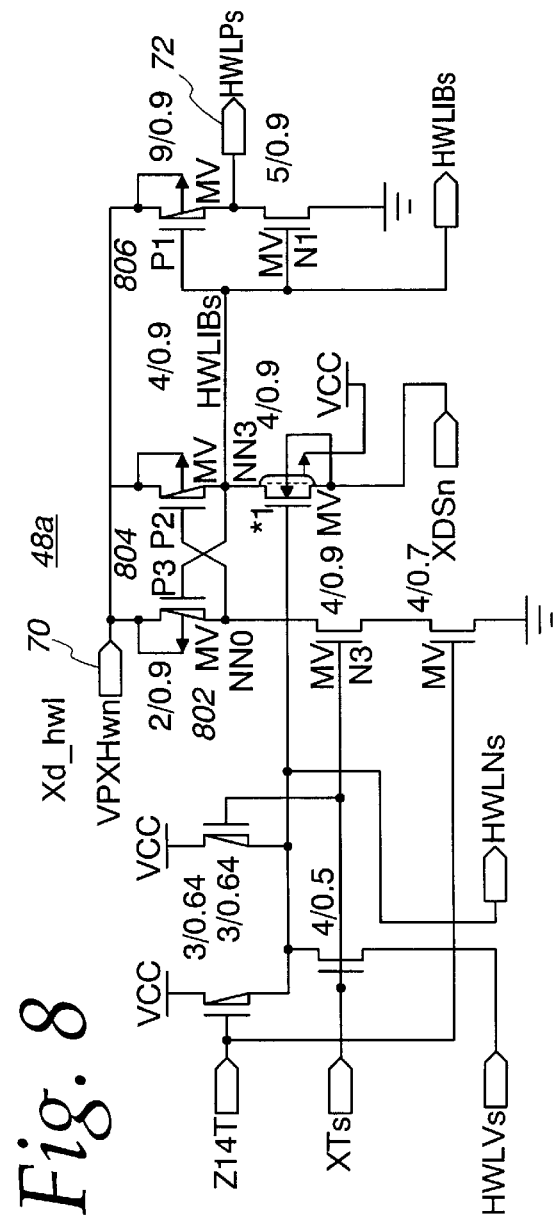
Fig. 7
Fig. 8

METHOD TO REDUCE CAPACITIVE LOADING IN FLASH MEMORY X-DECODER FOR ACCURATE VOLTAGE CONTROL AT WORDLINES AND SELECT LINES

BACKGROUND OF THE INVENTION

This invention relates generally to row decoders used in NOR Flash memory architectures. More particularly, it relates to a semiconductor integrated circuit memory device which includes an apparatus and a method for reducing capacitive loading in a Flash memory X-decoder so as to accurately control the voltages at selected wordlines and block select lines.

As is generally known in the art, there exists a class of non-volatile memory devices referred to as "Flash EEPROMs" which has recently emerged as an important memory device by combining the advantages of EPROM density with EEPROM electrical erasability. Such Flash EEPROMs provide electrical erasing and a small cell size. In a conventional Flash EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

One type of architecture used for Flash memories is typically referred to as a NOR Flash memory architecture which is an array of Flash EEPROM cells (floating gate devices) which are divided into a plurality of sectors. Further, the memory cells within each sector are arranged in rows of wordlines and columns of bit lines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

In order to program the Flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +9 volts applied thereto. These voltages produce "hot electrons" which are accelerated across the thin dielectric layer and onto the floating gate. This hot electron injection results in an increase of the floating gate threshold by approximately two to four volts.

For erasing the Flash EEPROM cell in conventional operation, a positive potential (e.g., +5 volts) is applied to the source region. The control gate is applied with a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the Flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level approximately 50 to 100 $\mu$A. The programmed cell (storing a logic "0") will have considerably less current flowing.

For example, a 64 Mb (megabit) NOR Flash memory array architecture is illustrated in FIG. 1 which consists of four vertical blocks 10, 12, 14 and 16. Each of the vertical blocks 10–16 is composed of thirty-two sectors. Each of the 128 sectors store 512 Kbits of data arranged in 256 rows of wordlines and 2048 columns of bit lines. Further, each of the sectors S0 through S127 is formed of two array blocks (FIGS. 2a and 2b) AB-1 and AB-2. A plurality of X-decoders 18 are located between the four vertical blocks 10–16 so as to decode the wordlines in each sector from the left and right sides.

Further, there is often required voltages to be internally generated that are greater than an external or off-chip power supply potential VCC which is supplied to it. For example, it is known that in Flash EEPROMs operating at VCC equal to +3.0 volts, a high voltage of approximately +4.5 volts is needed to be produced for the reading mode of operation of the memory cells. As a consequence, the semiconductor memories also generally include an internal voltage boosting circuit for generating an output signal boosted to be higher than the external supply voltage.

In FIG. 1A, there is shown a simple diagram of a conventional technique for creating a boosted voltage for a wordline. A voltage booster circuit 2 is used for generating a global wordline supply voltage VPXG at node N1, which is passed to appropriate wordlines in the various sectors S0–S127 in the four vertical blocks 10–16 of the memory array via the corresponding X-decoders 18. The global wordline supply voltage VPXG is typically in the range of +4.0 volts to +5.0 volts, which is raised above the input power supply potential VCC of a nominal +3.0 volts. This boosted voltage VPXG is a target voltage which is desired to be maintained at all of the wordlines in the various sectors during a Read mode of operation.

However, since the boosted voltage VPXG applied to the wordline is created by the booster circuit, it will vary greatly with the power supply potential VCC, process corners, and temperature. Thus, the wordline voltage will not be very accurate and will cause errors to occur during the Read operation. Further, this boosted voltage VPXG must drive both the capacitance (5 pF–8 pF) associated with the wordline loading path and the parasitic capacitance (about 30 pF) associated with the N-well loading path in the X-decoder. As a result, the boosted voltage at the selected wordline will decrease due to the high capacitive loading that must be quickly charged during the Read mode.

In view of this, there has arisen a need to provide a way of reducing the capacitive loading in Flash memory X-decoder in order to produce accurate voltage control at selected wordlines and block select lines. This is accomplished in the present invention by separating the paths to the selected-wordlines and the block select lines from the one to the N-well parasitic loading.

SUMMARY OF THE INVENTION

Accordingly, it is a general object of the present invention to provide an apparatus and a method for reducing capacitive loading in a Flash memory X-decoder which is relatively simple in its construction, is easy to manufacture, and has improved accurate voltage control at selected wordlines in a short amount of time and block select lines during reading over the prior art memory devices.

It is an object of the present invention to provide an apparatus and a method for reducing capacitive loading in a Flash memory X-decoder so as to accurately control the voltages at selected wordlines and block select lines on an efficient and effective basis.

It is another object of the present invention to provide an apparatus and method for reducing capacitive loading in Flash memory X-decoder which includes decoder circuitry for separately applying a first boosted voltage to the wordline N-well region and a second boosted voltage to the selected wordline so as to reduce capacitive loading on the selected wordline due to heavy capacitive loading associated with the wordline N-well region.

It is still another object of the present invention to provide an apparatus and a method for reducing capacitive loading in a Flash memory X-decoder which includes booster circuitry for generating a first boosted voltage to be higher than a power supply potential for driving a wordline N-well region and a second boosted voltage to be higher than the power supply potential for driving a selected wordline during a Read mode of operation.

In accordance with a preferred embodiment of the present invention, there is provided a method for reducing capacitive loading in a memory device so as to accurately control the voltage at selected wordlines. A first boosted voltage is generated to be higher than a power supply potential for driving a wordline N-well region. A second boosted voltage is also generated to be higher than the power supply potential for driving a selected wordline during a Read mode of operation. Decoder circuitry is provided for separately applying the first boosted voltage to the wordline N-well region and the second boosted voltage to the selected wordline so as to reduce capacitive loading on the selected wordline due to heavy capacitive loading associated with the wordline N-well region.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 2a and 2b, when connected together, is a block diagram of an X-decoder for use with one sector of the memory array of FIG. 1, constructed in accordance with the principles of the present invention;

FIG. 5 is a detailed schematic circuit diagram of the VPX sector select circuit 42 of FIG. 2;

FIG. 6 is a detailed schematic circuit diagram of the vertical wordline decoder 44 of FIG. 2;

FIG. 7 is detailed schematic circuit diagram of the sector select decoder 46a for select gate of FIG. 2;

FIG. 8 is a detailed schematic circuit diagram of the horizontal wordline decoder 48a of FIG. 2; and FIG. 9 is a detailed schematic circuit diagram of the wordline driver circuit 49 of FIG. 2.

DESCRIPTION OF THE PREFERRED EMBODIMENT

A decoder structure and a method for reducing capacitive loading in a Flash memory X-decoder are described. In the following description, numerous specific details are set forth, such as specific circuit configurations, components, and the like in order to provide a thorough understanding of the present invention. However, it should be apparent to those skilled in the art that the present invention may be practiced without the specific details. In other instances, well-known processes, circuits, and control lines, not particularly relevant to the understanding of the operating principles of the present invention, have been purposely omitted for the sake of clarity.

Figure 1:
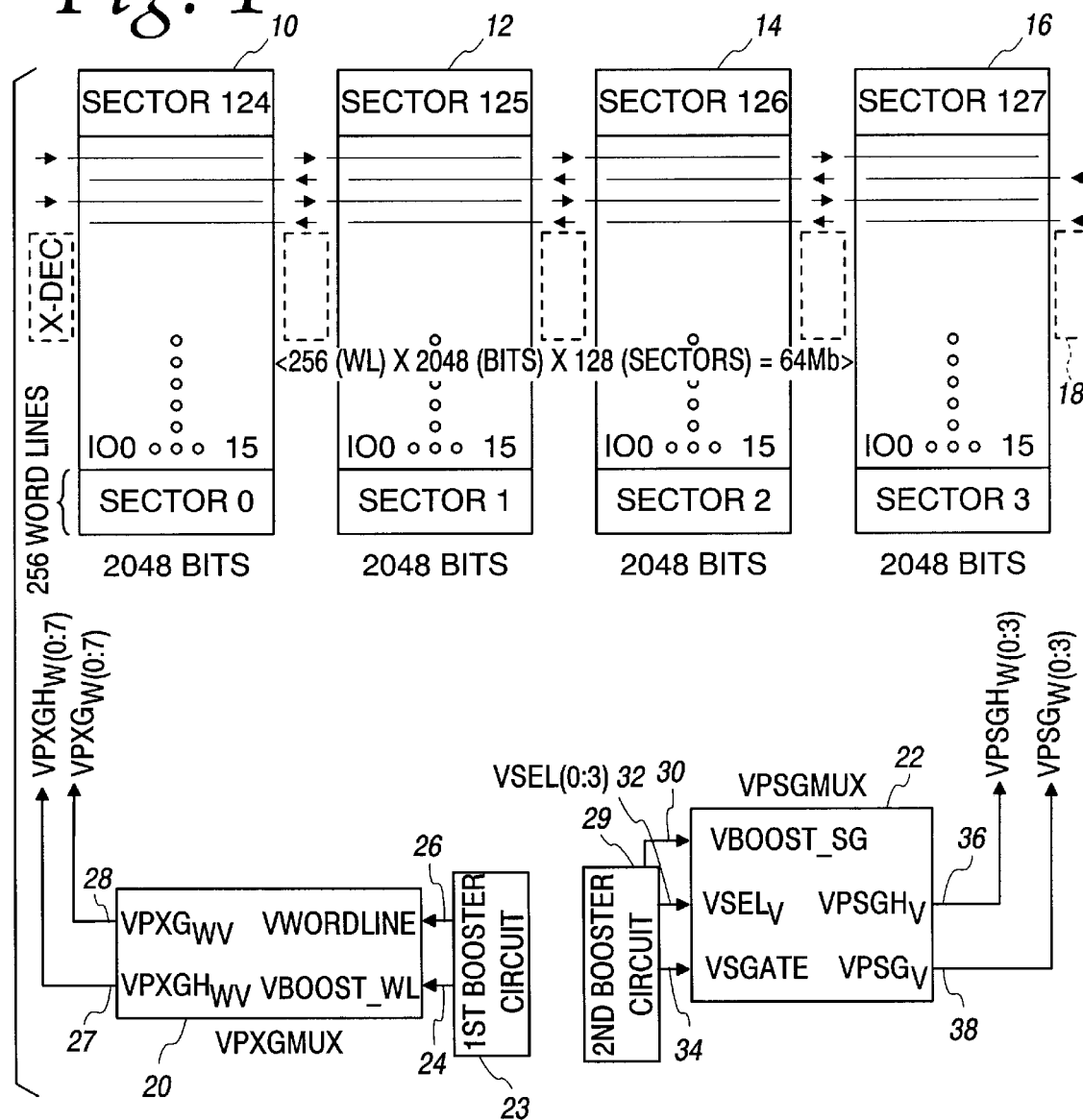
FIG. 1 its a simplified block diagram of a conventional 64 Mb NOR Flash memory array architecture, utilizing the X-decoders and booster circuitry of the present invention.
Figure 1A:
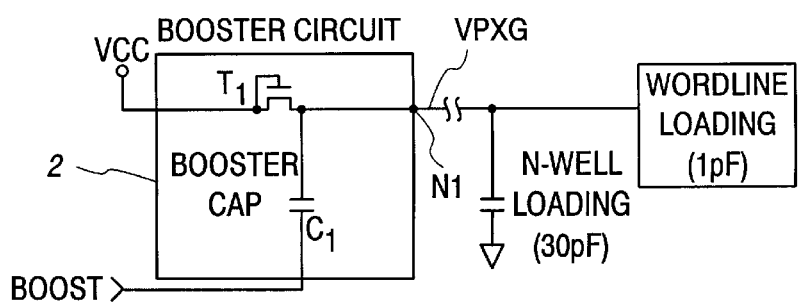
FIG. 1A is a simple diagram of a conventional technique for creating a boosted voltage for a wordline.

Referring now in detail to the drawings, there is shown in block diagram form in FIG. 1 a 64 Mb NOR Flash memory architecture which includes four vertical blocks 10, 12, 14 and 16. Each of the blocks 10–16 is comprised of thirty-two sectors. Each of the 128 sectors S0 through S127 stores 512 Kbits of data arranged in 256 rows of wordlines and 2,048 columns of bitlines. Thus, the memory size is 256 (wordline)×2048 (bits)×128 (sectors)=64 Mb.

Figures 3, 4:
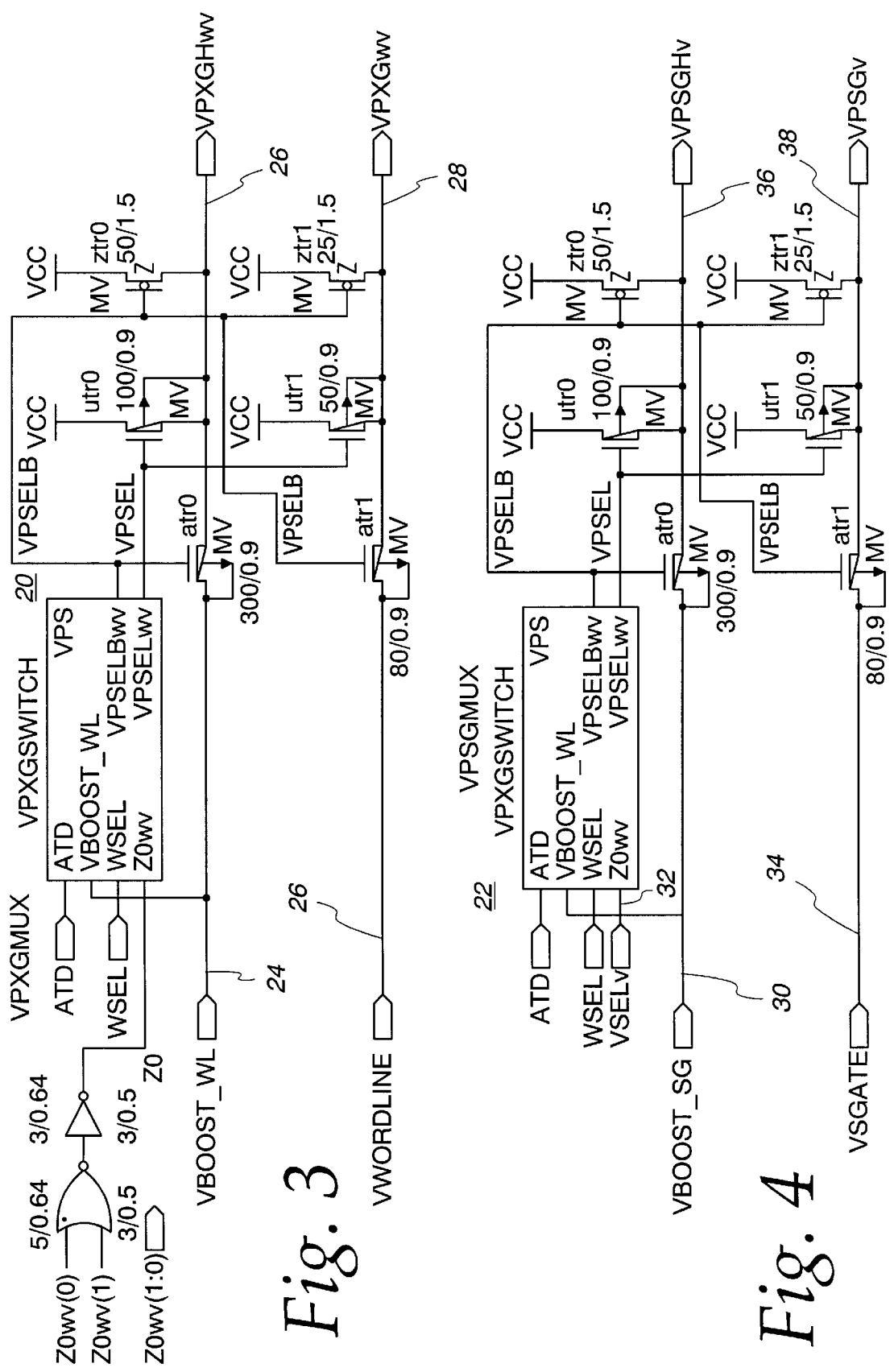
FIG. 3 is a detailed schematic circuit diagram of the VPXMUX selector circuit 20 of FIG. 1.
FIG. 4 is a detailed schematic circuit diagram of the VPSGMUX selector circuit 22 of FIG. 1.

In order to select one of the four vertical blocks 10–16, they are provided a VPXGMUX selector circuit 20 and a VPSGMUX selector circuit 22 (one of each being shown). In practice, there are eight VPXGMUX selector circuits 20 used, one being located on the left and right sides of each vertical block 10–16. Also, there are four VPSGMUX selector circuits 22 used, one being located on the left side of each vertical block 10–16. The selector circuit 20 receives a boosted signal VBOOST_WL on line 24 from a first booster circuit 23 and a wordline signal VWORDLINE on line 26 therefrom. The selector circuit 20 is used to pass an N-well signal VPXGH on line 27, which is in the range of +4.5 to +6.2 volts, and is connectable to a wordline N-well region. The VPXGMUX selector circuit 20 also passes a wordline signal VPXG on line 28, which is about +4.2 volts, and is connectable to a selected wordline. A detailed schematic circuit diagram of the VPXGMUX selector circuit 20 is shown in FIG. 3.

Similarly, the VPSGMUX selector circuit 22 receives boosted signal VBOOST_SG on line 30 from a second booster circuit 29, a select signal VSEL on line 32, and a select gate signal VSGATE on line 34 from the second booster circuit. The VPSGMUX selector circuit 22 is used to pass an N-well signal VPSGH on line 36, which is in the range of +4.5 to +6.2 volts and is connectable to a select gate N-well region. The generator circuit 22 also passes a select gate signal VPSG on line 38, which is about +1.5 volts and is connectable to gates of select gate transistors. A detailed schematic circuit diagram of the VPSGMUX selector circuit 22 is shown in FIG. 4.

Further, a plurality of X-decoders 18 of the present invention are located between the vertical blocks 10–16 and on the outer sides of the blocks 10 and 16 so as to decode each sector from the left and right sides thereof. A block diagram of one of the X-decoders 18 for use with one sector S of the sectors S0–S127 of the array architecture of FIG. 1 is illustrated in FIGS. 2a and 2b.

Figure 2B:
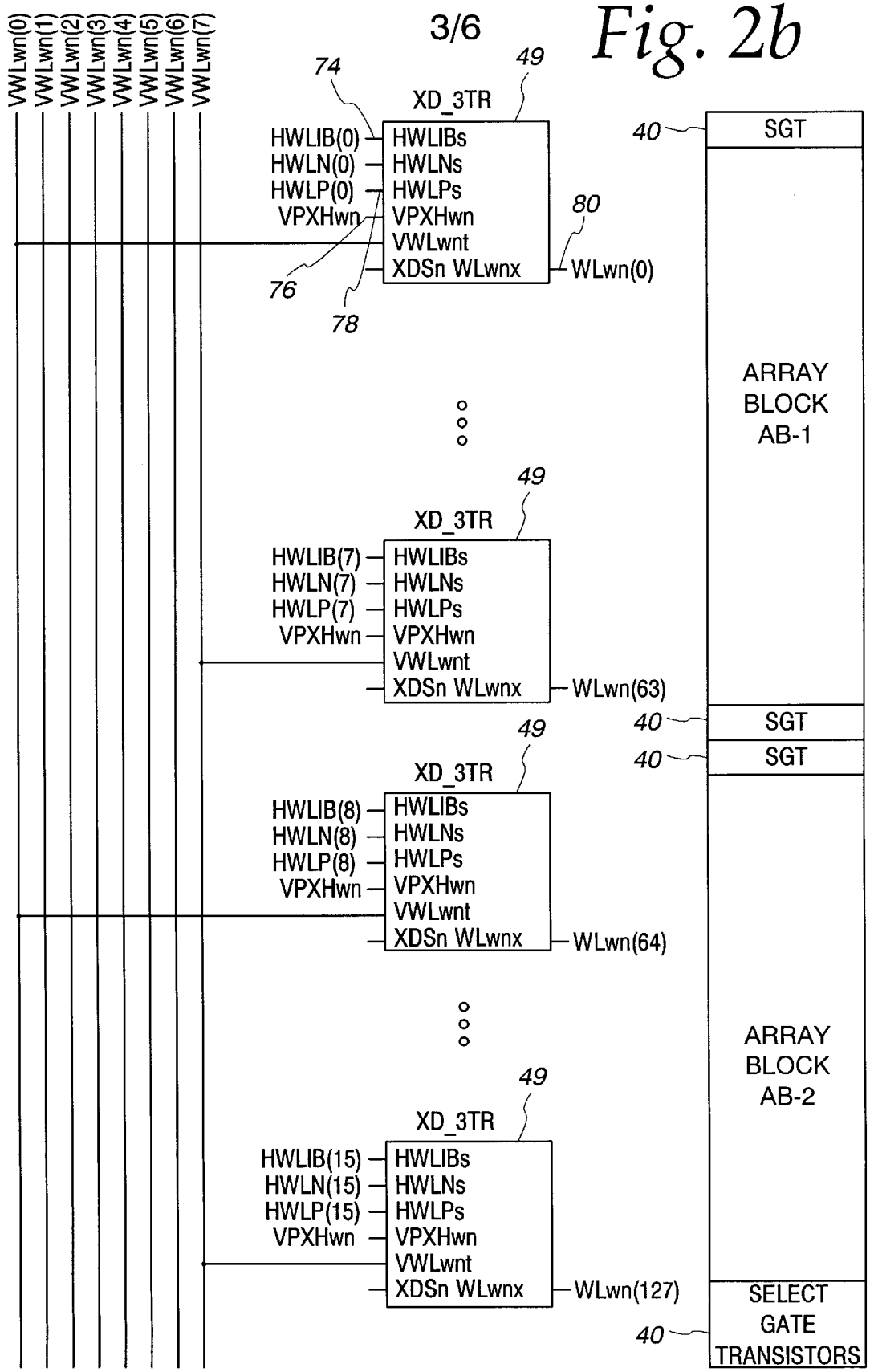

As can be seen from FIGS. 2a and 2b, the one sector S is formed of two array blocks AB-1 and AB-2. The upper array block AB-1 has connected on its top and bottom portions select gate transistor (SGT) block 40. Likewise, the lower array block AB-2 has connected on its top and bottom portions select gate transistor (SGT) block 40. The X-decoder 18 includes a VPX wordline sector select decoder 42 for selecting one of the 32 sectors in the selected vertical block, a xd_vwl vertical decoder 44, a xd_sel sector select decoder 46a, 46b, xd_hwl horizontal decoder 48a, 48b, and wordline drivers 49. The decoders 46a and 46b are identical in their construction with the decoder 46a being used with the upper array block AB-1, and the decoder 46b being used with the lower array block AB-2. Similarly, the decoders 48a and 48b are identical in their construction with the decoder 48a being associated with the array block AB-1 and the decoder 48b being associated with the array block AB-2.

A detailed schematic circuit diagram of the VPX wordline sector select decoder 42 is illustrated in FIG. 5. The VPX decoder 42 receives on line 50 the N-well signal VPXGH from the VPXGMUX selector circuit 20 and receives on line 52 the wordline signal VPXG therefrom. The VPXG decoder 42 passes an N-well voltage VPXH on line 54 and a sector select wordline voltage VPX on line 56. The VPX decoder 42 includes a pair of cross-coupled P-channel transistors 502, 504 and output transistors 506, 508. The sources and N-well regions of the transistors 502 and 504 are connected together and connected to receive the N-well signal VPXGH. The gate of the transistor 502 and the drain of the transistor 504 are connected together at a node NA2. The gate of the transistor 504 and the drain of the transistor 502 are connected together at a node NA1.

The output transistor 506 has its source and N-well region connected together and also connected to receive the N-well signal VPXGH. The gate of the transistor 506 is also connected to the node NA2 and the drain thereof is connected to the line 54 for providing the N-well voltage VPXH. The output transistor 508 has its source connected to receive the separate wordline signal VPXG, its gate connected to the node NA2, and its drain connected to the line 56 for providing the sector select wordline voltage VPX. Unlike the prior art, the VPXG signal has been isolated from the VPXGH signal since the source and N-well region of the transistor 508 have been separated from each other and its source is not tied to the VPXGH signal.

In operation, when the node NA2 is at a low level for a selected sector, the transistor 506 will be turned on so as to produce the VPXH N-well voltage, which varies between +4.5 to +6.2 volts, on the line 54. Also, the transistor 508 will be turned on so as to pass the VPX wordline voltage of about +3.8 volts on the line 56. In this manner, it can be seen that the VPXH voltage on the line 54 which is fed to the N-well regions has been separated from the VPX voltage on the line 56 which is fed to the wordline. As a result, the parasitic heavy capacitive loading (about 30 pF) due to the N-well region path has been separated from the small capacitive loading (about 5–8 pF) due to the wordline path. Since the capacitance in the wordline loading path is very small, an accurate voltage can now be created quickly at the selected wordline. In addition, the heavy-loaded N-well loading path can now be driven by a simpler boosting circuit since the voltage for the N-well loading path is not required to be accurately controlled as is needed for the wordline voltage.

A detailed schematic circuit diagram of the xd_vwl vertical wordline decoder 44 is depicted in FIG. 6. The vertical wordline decoder 44 receives on line 58 the N-well voltage VPXH from the VPX decoder 42 and on line 60 the sector select wordline voltage VPX therefrom. The vertical decoder 44 generates a select vertical wordline voltage VWL on line 62. The vertical decoder 44 includes a pair of cross-coupled P-channel transistors 602, 604 and an output transistor 606. The sources and N-well regions of the transistors 602 and 604 are connected together and connected to receive the N-well voltage VPXH. The gate of the transistor 602 and the drain of the transistor 604 are connected together at a node NN2. The gate of the transistor 604 and the drain of the transistor 602 are connected together at a node NN1.

The output transistor 606 has its N-well region connected also to receive the N-well signal VPXH and has its source connected to receive the sector select wordline voltage VPX. The gate of the transistor 606 is also connected to the node NN2 and the drain thereof is connected to the line 62 for providing the select vertical wordline voltage VWL.

Since the xd_sel select gate decoders 46a and 46b are identical, it will be sufficient to describe in detail only one of them. A detailed schematic circuit diagram of the select gate decoder 46a is illustrated in FIG. 7. The decoder 46a receives on line 64 the N-well signal VPSGH from the VPSGMUX selector 22 and receives on line 66 the select gate signal VPSG therefrom. The decoder 46a generates a selected gate voltage SEL on line 68. The decoder 46a includes a pair of cross-coupled P-channel transistors 702, 704 and an output transistor 706. The sources and N-well regions of the transistors 702, 704 are connected together and connected to receive the N-well signal VPSGH. The gate of the transistor 702 and the drain of the transistor 704 are connected together at a node SELB. The gate of the transistor 704 and the drain of the transistor 702 are connected together at a node NN4. The output transistor 706 has its N-well region connected also to receive the N-well signal VPSGH and its source connected to receive the select gate signal VPSG. Thus, the VPSG signal has been isolated from the VPSGH signal since the source and N-well region of the transistor 706 have been separated from each other and its source is not tied to the VPSGH signal. The gate of the transistor 706 is also connected to the node SELB and the drain thereof is connected to the line 68 for providing the select gate voltage SEL.

Since the xd_hwl horizontal wordline decoders 48a and 48b are identical, it will be sufficient to describe in detail only one of them. In FIG. 8, there is shown a detailed schematic circuit diagram of the xd_hwl horizontal wordline decoder 48a. The decoder 48a receives on line 70 the N-well voltage VPXH from the VPX generator circuit 42. The decoder 48a generates on line 72 the select horizontal wordline voltage HWLP. The horizontal wordline decoder 48a includes a pair of cross-coupled P-channel transistors 802, 804 and an output transistor 806. The sources and N-well regions of the transistors 802 and 804 are connected together and connected to receive the N-well signal VPXH. The gate of the transistor 802 and the drain of the transistor 804 are connected together at a node NN3. The gate of the transistor 804 and the drain of the transistor 802 are connected together at a node NN0. The output transistor 806 has its source and N-well region connected together and also connected to receive the N-well signal VPXH. The gate of the transistor 806 is also connected to the node NN3 and the drain thereof is connected to the line 72 for generating the select horizontal wordline voltage HWLP.

Referring now to FIG. 9, there is illustrated a schematic circuit diagram of one of the 128 wordline drivers 49. It should be understood that there is a wordline driver for each of the 256 wordlines in a sector. The wordline driver 49 receives on line 74 the select vertical wordline voltage VWL from the decoder 44, on line 76 the N-well signal VPXH from the VPX generator circuit 42, and on line 78 the select horizontal wordline voltage HWLP from the horizontal decoder 48a. The wordline driver 49 passes the selected wordline voltage WL on line 80. Thus, the wordline voltage VWL has been isolated from the N-well signal VPXH since the source and N-well region of the transistor 902 have been separated from each other and its source is not tied to the VPXH signal. The wordline decoder includes a P-channel transistor 902 having its source connected to receive the vertical wordline voltage VWL, its gate connected to receive the horizontal wordline voltage HWLP, and its drain connected to the line 80 for providing the selected wordline voltage WL. The N-well region of the transistor 902 is connected to receive the N-well region signal VPXH. In operation, when the horizontal wordline voltage on the gate of the transistor 902 is low, the transistor 902 will be turned on so as to supply the vertical wordline voltage VWL to the line 80.

From the foregoing detailed description, it can thus be seen that the present invention provides a method for reducing capacitive loading in a Flash memory X-decoder. The decoder structure of the present invention includes decoder circuitry for separately applying a first boosted voltage to the wordline N-well region and a second boosted voltage to the selected wordline so as to reduce capacitive loading on the selected wordline in order to create an accurate voltage at the wordline in a short amount of time.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor memory device including an array of Flash EEPROM memory cells, the improvement comprising in combination a decoding structure for reducing capacitive loading so as to accurately control the voltages at selected wordlines and block select lines:

a memory array having a plurality of memory core cells divided into a plurality of sectors, each sector having the memory core cells therein arranged in rows of wordlines and columns of bit lines intersecting the rows of wordlines;

first booster circuit means for generating a first boosted voltage to be higher than a power supply potential for driving a wordline N-well region and a second boosted voltage to be higher than the power supply potential for driving a selected wordline during a Read mode of operation;

second booster circuit means for generating a third boosted voltage to be higher than the power supply potential for driving a select gate N-well region and a fourth boosted voltage to be higher than the power supply potential for driving a block select line;

decoding structure including wordline decoding means responsive to said first and second boosted voltages for separately applying said first boosted voltage to the wordline N-well region and said second boosted voltage to the selected wordline so as to reduce capacitive loading on the selected wordline due to heavy capacitive loading associated with the wordline N-well region; and said decoding structure further including select gate decoding means responsive to said third and fourth boosted voltage for separately applying said third boosted voltage to the select gate N-well region and said fourth boosted voltage to the select block select line so as to reduce capacitive loading on the block select line due to heavy capacitive loading associated with the select gate N-well region.

2. In a semiconductor memory device as claimed in claim 1, wherein said wordline decoder means includes a wordline sector select decoder circuit having inputs connected to receive said first and second boosted voltages and outputs for separately generating an N-well voltage and a select wordline voltage.

3. In a semiconductor memory device as claimed in claim 2, wherein said wordline decoder means further includes a vertical wordline decoder circuit having inputs connected to receive the N-well voltage and the sector select wordline voltage and having outputs for generating a select vertical wordline voltage.

4. In a semiconductor memory device as claimed in claim 3, wherein said select gate decoding means includes a sector select gate decoder circuit having inputs connected to receive the said third and fourth boosted voltages and outputs for generating a block select line voltage.

5. In a semiconductor memory device as claimed in claim 4, wherein said select gate decoder means further includes a horizontal wordline decoder circuit having an input connected to receive the wordline N-well region voltage and for generating a select horizontal wordline voltage.

6. In a semiconductor memory device as claimed in claim 5, wherein said decoding structure further includes wordline driver means responsive to said select vertical wordline voltage and said select horizontal wordline voltage for generating a selected wordline voltage.

7. In a semiconductor memory device as claimed in claim 1, wherein said first boosted voltage is in the range of +4.5 to +6.2 volts.

8. In a semiconductor memory device as claimed in claim 7, wherein said second boosted voltage is about +3.8 volts.

9. In a semiconductor memory device as claimed in claim 8, wherein said fourth boosted voltage is about +1.5 volts.

10. A method for reducing capacitive loading in a Flash memory device so as to accurately control voltages at selected wordlines and block select lines, said method comprising the steps of:

providing a memory array having a plurality of memory core cells divided into a plurality of sectors, each sector having the memory core cells therein arranged in rows of wordlines and columns of bit lines intersecting the rows of wordlines;

generating a first boosted voltage to be higher than a power supply potential for driving a wordline N-well region and a second boosted voltage to be higher than the power supply potential for driving a selected wordline during a Read mode of operation;

generating a third boosted voltage to be higher than the power supply potential for driving select gate N-well region and a fourth boosted voltage to be higher than the power supply potential for driving a block select line;

separately applying said first boosted voltage to the wordline N-well region and said second boosted voltage to the selected wordline so as to reduce capacitive loading on the selected wordline due to heavy capacitive loading associated with the wordline N-well region; and separately applying said third boosted voltage to the select gate N-well region and said fourth boosted voltage to the select block select line so as to reduce capacitive loading on the block select line due to heavy capacitive loading associated with the select gate N-well region.

11. In a semiconductor memory device as claimed in claim 10, wherein said first boosted voltage is in the range of +4.5 to +6.2 volts.

12. In a semiconductor memory device as claimed in claim 11, wherein said fourth boosted voltage is about +1.5 volts.

13. A method for reducing capacitive loading in a memory device so as to accurately control voltages at selected wordlines, said method comprising the steps of:

generating a first boosted voltage to be higher than a power supply potential for driving a wordline N-well region;

generating a second boosted voltage to be higher than the power supply potential for driving a selected wordline during a Read mode of operation; and decoding means for separately applying said first boosted voltage to the wordline N-well region and said second boosted voltage to the selected wordline so as to reduce capacitive loading on the selected wordline due to heavy capacitive loading associated with the wordline-well region.

14. In a semiconductor memory device as claimed in claim 13, wherein said first boosted voltage is in the range of +4.5 to +6.2 volts.

15. In a semiconductor memory device as claimed in claim 14, wherein said second boosted voltage is about +3.8 volts.

16. In a semiconductor memory device including an array of Flash EEPROM memory cells, the improvement comprising in combination a decoding structure for reducing capacitive loading so as to accurately control the voltages at selected wordlines and block select lines:

a memory array having a plurality of memory core cells divided into a plurality of sectors, each sector having the memory core cells therein arranged in rows of wordlines and columns of bit lines intersecting the rows of wordlines;

a first booster circuit for generating a first boosted voltage to be higher than a power supply potential for driving a wordline N-well region and a second boosted voltage to be higher than the power supply potential for driving a selected wordline during a Read mode of operation;

a second booster circuit for generating a third boosted voltage to be higher than the power supply potential for driving a select gate N-well region and a fourth boosted voltage to be higher than the power supply potential for driving a block select line;

decoding structure including a wordline decoder responsive to said first and second boosted voltages for separately applying said first boosted voltage to the wordline N-well region and said second boosted voltage to the selected wordline so as to reduce capacitive loading on the selected wordline due to heavy capacitive loading associated with the wordline N-well region; and said decoding structure further including a select gate decoder responsive to said third and fourth boosted voltage for separately applying said third boosted voltage to the select gate N-well region and said fourth boosted voltage to the select block select line so as to reduce capacitive loading on the block select line due to heavy capacitive loading associated with the select gate N-well region.

17. In a semiconductor memory device as claimed in claim 16, wherein said wordline decoder includes a wordline sector select decoder circuit having inputs connected to receive said first and second boosted voltages and outputs for separately generating an N-well voltage and a select wordline voltage.

18. In a semiconductor memory device as claimed in claim 17, wherein said wordline decoder further includes a vertical wordline decoder circuit having inputs connected to receive the N-well voltage and the sector select wordline voltage and having outputs for generating a select vertical wordline voltage.

19. In a semiconductor memory device as claimed in claim 18, wherein said select gate decoder includes a sector select gate decoder circuit having inputs connected to receive the said third and fourth boosted voltages and outputs for generating a block select line voltage.

20. In a semiconductor memory device as claimed in claim 19, wherein said select gate decoder further includes a horizontal wordline decoder circuit having an input connected to receive the wordline N-well region voltage and for generating a select horizontal wordline voltage.

21. In a semiconductor memory device as claimed in claim 20, wherein said decoding structure further includes a wordline driver responsive to said select vertical wordline voltage and said select horizontal wordline voltage for generating a selected wordline voltage.

22. In a semiconductor memory device as claimed in claim 21, wherein said first boosted voltage is in the range of +4.5 to +6.2 volts.

23. In a semiconductor memory device as claimed in claim 22, wherein said second boosted voltage is about +3.0 volts.

24. In a semiconductor memory device as claimed in claim 23, wherein said fourth boosted voltage is about +1.5 volts.

* * * * *